United States Patent [19]

Peidous et al.

[11] Patent Number: 6,027,982
[45] Date of Patent: Feb. 22, 2000

[54] METHOD TO FORM SHALLOW TRENCH ISOLATION STRUCTURES WITH IMPROVED ISOLATION FILL AND SURFACE PLANARITY

[75] Inventors: Igor V. Peidous; Vladislav Y. Vassiliev; Chock H. Gan; Guang Ping Hua, all of Singapore, Singapore

[73] Assignee: Chartered Semiconductor Manufacturing Ltd., Singapore, Singapore

[21] Appl. No.: 09/245,565

[22] Filed: Feb. 5, 1999

[51] Int. Cl.[7] .................................................... H01L 21/76
[52] U.S. Cl. ......................... 438/424; 438/296; 438/425; 438/426; 148/DIG. 50
[58] Field of Search ..................... 438/424, 425, 438/426, 421, 296; 148/DIG. 50

[56] References Cited

U.S. PATENT DOCUMENTS

| | | | |
|---|---|---|---|
| 4,839,306 | 6/1989 | Wakamatsu | 437/67 |
| 5,258,332 | 11/1993 | Horioka et al. | 438/424 |
| 5,578,518 | 11/1996 | Koike et al. | 438/424 |
| 5,712,185 | 1/1998 | Tsai et al. | 438/424 |
| 5,719,085 | 2/1998 | Moon et al. | 438/424 |
| 5,747,866 | 5/1998 | Ho et al. | 257/506 |
| 5,780,346 | 12/1996 | Arghavani et al. | 438/424 |
| 5,837,612 | 8/1997 | Ajuria | 438/424 |
| 5,880,004 | 6/1997 | Ho | 438/424 |

Primary Examiner—Charles Bowers
Assistant Examiner—David S Blum
Attorney, Agent, or Firm—George O. Saile; Rosemary L.S. Pike

[57] ABSTRACT

A method to form shallow trench isolation structures with improved isolation fill and surface planarity is described. A pad oxide layer is provided over the surface of a semiconductor substrate. A silicon nitride layer is deposited overlying the pad oxide layer. A thin oxide layer is deposited overlying the silicon nitride layer. An isolation trench is etched through the thin oxide layer, the nitride layer, and the pad oxide layer and into the substrate. The silicon nitride layer exposed within the trench is etched to form a lateral undercut leaving a projection of the thin oxide layer and exposing a portion of the underlying pad oxide layer. The thin oxide layer and the exposed portion of the pad oxide layer are etched away thereby exposing portions of the surface of the substrate. A liner oxide is grown on the exposed portions of the semiconductor substrate within the isolation trench and on the surface of the substrate. A layer of isolation dielectric is deposited overlying the liner oxide and the silicon nitride and filling the isolation trench. The isolation dielectric is polished away stopping at the silicon nitride layer. The remaining silicon nitride etched away. The isolation dielectric and the pad oxide are etched away from the surface of the semiconductor substrate. The fabrication of the integrated circuit device is completed.

20 Claims, 5 Drawing Sheets

METHOD TO FORM SHALLOW TRENCH ISOLATION STRUCTURES WITH IMPROVED ISOLATION FILL AND SURFACE PLANARITY

BACKGROUND OF THE INVENTION

(1) Field of the Invention

The invention relates to a method of fabricating semiconductor structures, and more particularly, to the formation of shallow trench isolation structures with improved isolation fill and surface planarity.

(2) Description of the Prior Art

As integrated circuit feature sizes continue to shrink, one of the limiting factors in this size reduction is the technique for active area isolation. Traditionally in the art, active areas have been isolated from each other through the formation of local oxidation of silicon, or LOCOS, structures. LOCOS structures provide good electrical isolation of active areas such as transistor source and drain regions. However, LOCOS structures consume substantial amounts of silicon surface area. This means that the available area for active devices such as transistors is reduced. Further, the LOCOS structure is three-dimensional and creates a non-planar surface topology that adversely affects the process yield and complexity of the processing steps that come after the LOCOS formation.

To reduce the silicon area used for isolation regions and to improve the planarity of these regions, a new technique, called shallow trench isolation, or STI, has been developed. In STI, trenches or grooves are etched into the top surface of the silicon wafer. These grooves are then filled with an isolating dielectric such as silicon oxide. This isolating dielectric is then made planar to the surface of the substrate by etching or chemical mechanical polishing (CMP). STI structures made in this way can be made substantially smaller than comparable LOCOS structures. Therefore less of the silicon surface is used for isolation and more is available for active devices. Since the STI structures are made planar, the processing problems presented by the LOCOS surface topology are solved.

Even with its advantages when compared to LOCOS, prior art STI structures do have several problems associated with the integrity and planarity of the isolating dielectric.

The first problem is that, under certain conditions, voids can form in the isolating dielectric that fills the trench. A cross-sectional view of a partially completed STI structure is shown in FIG. 1. A semiconductor substrate 11 is shown. Layers of pad oxide 12 and silicon nitride 13 have been deposited on the surface of the substrate 11. A trench has been etched through the silicon nitride 13 and pad oxide 12 and partially into the substrate 11. An isolation dielectric 14 such as silicon oxide is deposited over the silicon wafer to fill the STI trench.

As can be seen in the illustration, a void has formed in the isolation dielectric 14. The likelihood of this void forming increases as the aspect ratio of the trench increases. The aspect ratio is the ratio between the depth of the trench L1 and the width of the trench L2. It is observed in the art that if the aspect ratio (L1:L2) is greater than 1:1, then voids will form in the isolation dielectric 14. Unfortunately, aspect ratios exceeding 1:1 and even approaching 1.5:1 are needed as integrated circuit device geometry continues to decrease. Further, if such a void forms, then, when the surface conductive layers are later deposited, residue from these conductive materials can be trapped in this void. These trapped conductive residues can then cause electrical short paths between layer elements that were supposed to be electrically isolated.

The second problem is that the edges of the top surface of the isolation dielectric of the STI are typically recessed at the corners of substrate active area. FIG. 2 illustrates this problem. After the STI trench is formed in the substrate 21 and filled with the isolation dielectric 22, the wafer is subjected to chemical mechanical polishing, or CMP, cleaning, and etching processes to remove excess oxide and nitride material. In STI structures typical in the art, the anisotropic component of the oxide-etching step will cause the recession of the isolation dielectric surface 23 near the edges of the STI trench. Unfortunately, such edge recession exposes the corners of the silicon substrate 21 in the active area. This causes sub-threshold leakage currents and reduction in gate oxide dielectric breakdown for the active device formed in this area adjacent to the STI.

The third problem is that the top corners 24 of the STI trench are relatively sharp, as seen in FIG. 2. This topology causes the STI structure to be susceptible to parasitic corner transistor formation.

Several prior art approaches attempt to reduce the likelihood or severity of isolation dielectric voids, exposure of the substrate active area due to edge recession, and to improve the roundness of the top corners of the STI structure. U.S. Pat. No. 5,747,866 to Ho et al shows a process which can round the corners of the STI interface with the active area through the formation of an oxide liner. U.S. Pat. No. 5,719,085 to Moon et al teaches the STI process that undercuts the pad oxide layer with an HF etch and forms an oxide liner that rounds the active area corner. U.S. Pat. No. 4,839,306 to Wakamatsu shows an isolation method that uses etching to make the active area corners rounded.

SUMMARY OF THE INVENTION

A principal object of the present invention is to provide an effective and very manufacturable method of fabricating a STI structure.

A further object of the present invention is to provide a manufacturing method that greatly reduces the likelihood of voids forming in the isolation dielectric of the STI structure.

Yet a further object of the present invention is to provide a manufacturing method that greatly reduces the likelihood of exposure of the substrate active area due to edge recession of the STI structure.

Still yet a further object of the present invention is to provide a manufacturing method that improves the electrical isolation of the STI structure by rounding the top edge corners.

In accordance with the objects of this invention, a new method of fabricating the STI structure has been achieved. This STI structure has an improved topology that greatly reduces the likelihood both of isolation dielectric voids as well as exposure of the substrate active area due to edge recession while improving the roundness of the active area corners. A semiconductor substrate is provided. A pad oxide layer is provided over the surface of the substrate. A silicon nitride layer is deposited overlying the pad oxide layer. A thin oxide layer is deposited overlying the nitride layer. Isolation trenches are etched through the thin oxide layer, silicon nitride layer, and pad oxide layer. The isolation trench is further etched into the semiconductor substrate. The silicon nitride layer is etched laterally to undercut the thin oxide layer. The thin oxide layer is removed. A layer of liner oxide is grown on the exposed silicon of the trench. A layer of isolation dielectric is deposited overlying the silicon nitride and the trench. The isolation dielectric is polished down to the top surface of the silicon nitride. The silicon nitride is removed. Isolation dielectric extending above the surface and remaining thin oxide layer is stripped. This completes the formation of shallow trench isolations in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 3:
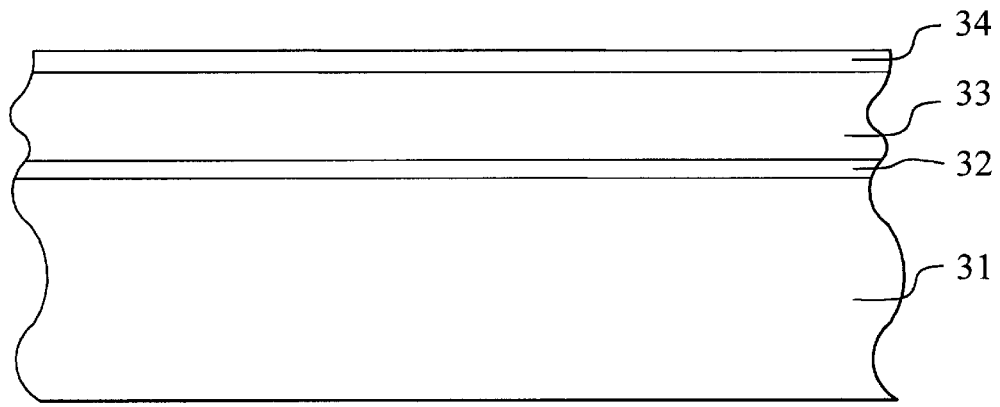
FIGS. 3 through 12 schematically illustrate in crosssectional representation a preferred embodiment of the present invention.

Referring now more particularly to FIG. 3, there is illustrated a portion of a partially completed STI structure. Semiconductor substrate 31 is preferably composed of monocrystalline silicon. A thin layer of silicon oxide, called pad oxide 32, is grown on the surface of the substrate 31 to a thickness of between about 100 and 200 Angstroms. A silicon nitride layer 33 is deposited over the pad oxide 32 to a thickness of between about 1500 and 2500 Angstroms. A second silicon oxide layer, called thin oxide 34, is deposited over the silicon nitride 33 to a thickness of between about 100 and 200 Angstroms.

Figure 4:
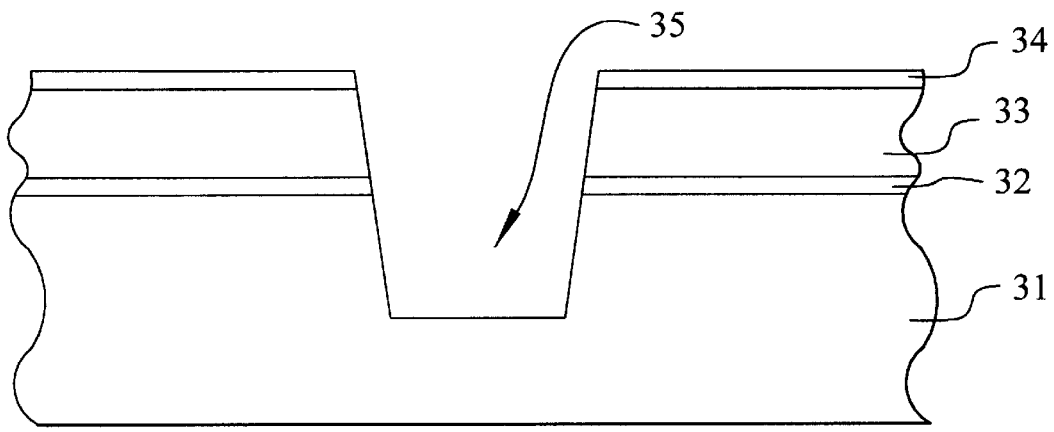

Referring now to FIG. 4, shallow trenches 35 are etched through the thin oxide 34, silicon nitride 33, and pad oxide 32. Further, these trenches are etched into the substrate 31. The trenches 35 may be as small as about 0.25 microns in width and are etched to a depth of between about 2000 and 3500 Angstroms.

Figure 5:
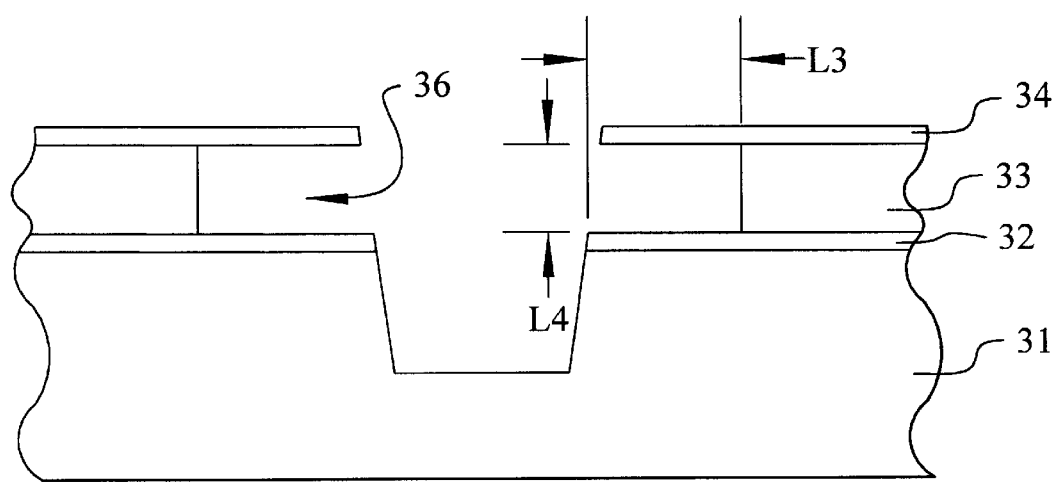

Referring to FIG. 5, a key feature of the present invention is described. Using preferably hot $H_3PO_4$, the silicon nitride 33 is etched. Because of the configuration of the pad oxide 32 below and the thin oxide 34 above, the etch laterally removes a section of the silicon nitride 33 sufficient to undercut the thin oxide 34 opening an area 36 as shown in FIG. 5. Note that a dry isotropic etch technique could also be used in this step. A key parameter in this process step is to time the etch such that the undercut dimension L3 is greater than or equal to the thickness dimension L4 of the silicon nitride 33. In the preferred embodiment, the hot $H_3PO_4$ etch is timed to between about 20 and 40 minutes. The undercut dimension L3 is between about 1500 and 2500 Angstroms.

Figure 6:
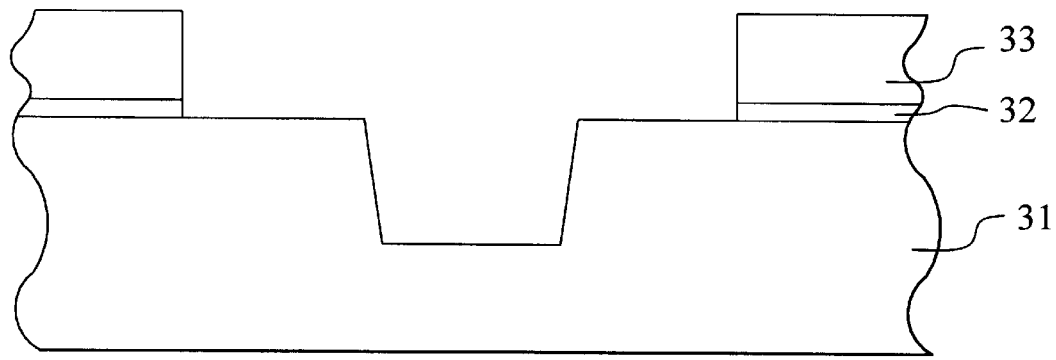

FIG. 6 shows the STI structure after it is subjected to a buffered HF dip process. The thin oxide layer 34 and the exposed sections of the pad oxide layer 32 are removed. The structure revealed shows a stair step profile that is a key feature of this STI method.

Figure 7:
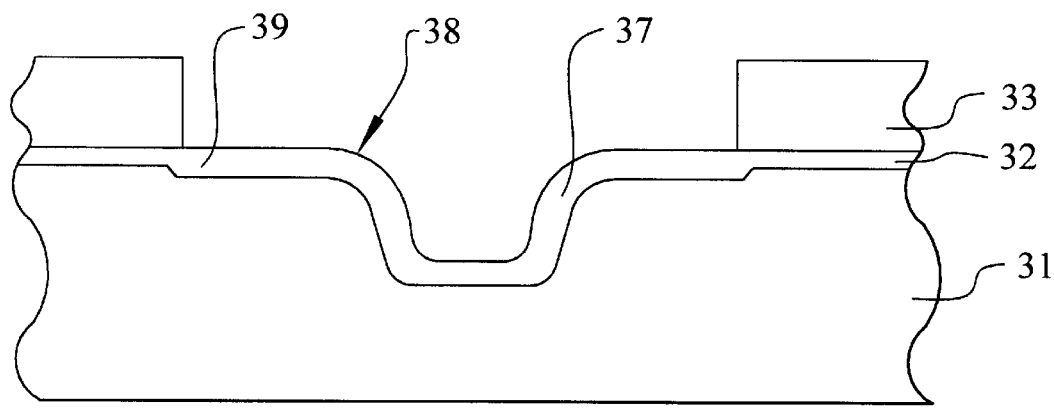

Referring now to FIG. 7, another key feature of the present invention is illustrated. A silicon oxide layer, called liner oxide 37, is thermally grown to a thickness of between about 200 and 300 Angstroms. As this liner oxide 37 grows into and out of the exposed silicon surfaces, it causes a rounding of the trench at the active corner 38. Further, since the liner oxide 37 growth is more intensive at the active corner 38, this causes the underlying surface of the substrate 31 to recede a greater distance as shown in area 39.

Figure 8:
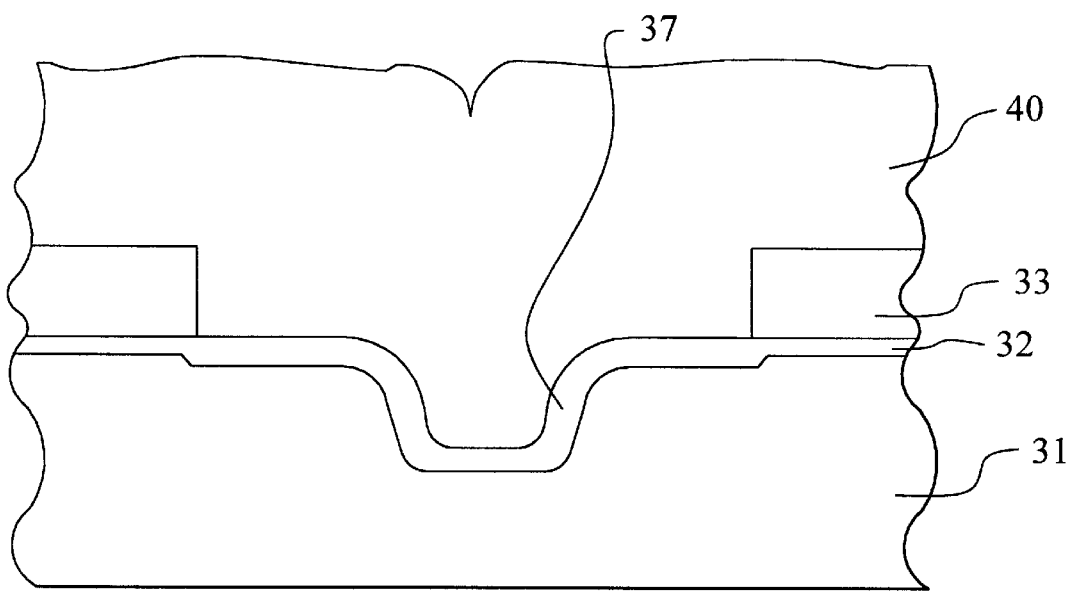

As shown in FIG. 8, now that the trench of the STI structure has been prepared with a preferable topology, an isolation dielectric 40 is deposited to a thickness of between about 5000 and 8000 Angstroms. The isolation dielectric 40 is preferably silicon oxide deposited by chemical vapor deposition, CVD. However, other materials and deposition techniques could be used.

Figure 9:
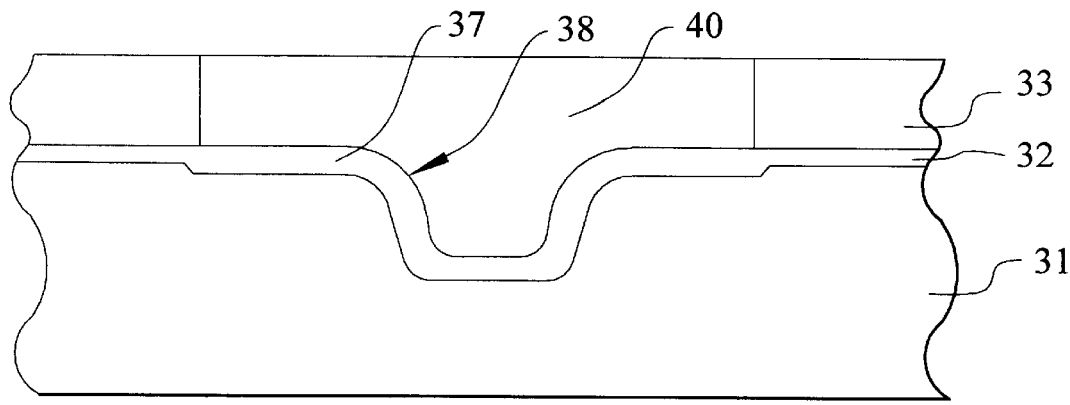

Referring now to FIG. 9, the isolation dielectric 40 is now removed to the level of the surface of the silicon nitride 33. A chemical mechanical polish, CMP, is performed on the wafer. The silicon nitride 33 acts as a stop layer for the CMP process.

Figure 10:
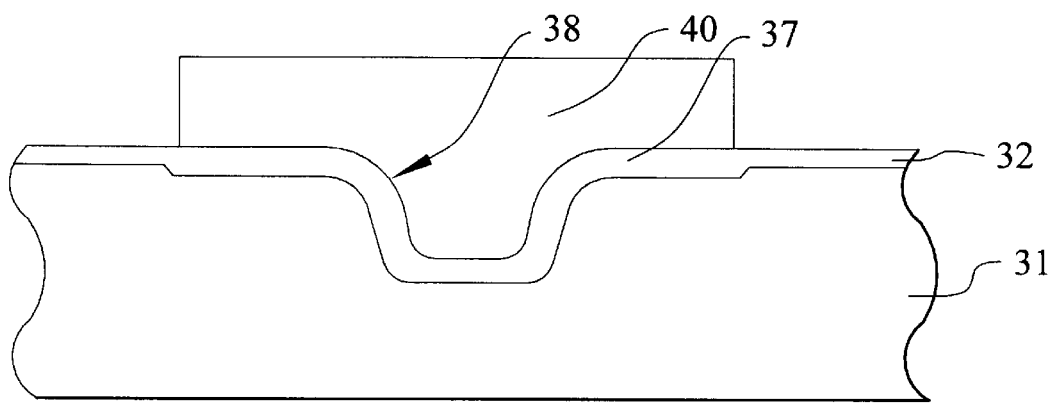

FIG. 10 shows the STI structure after the silicon nitride 33 is removed by a selective etch process. Yet another key feature of the preferred embodiment is that a covering of isolation dielectric 40 remains above the surface level of the substrate 31 overlapping the active edges 38.

Figure 11:
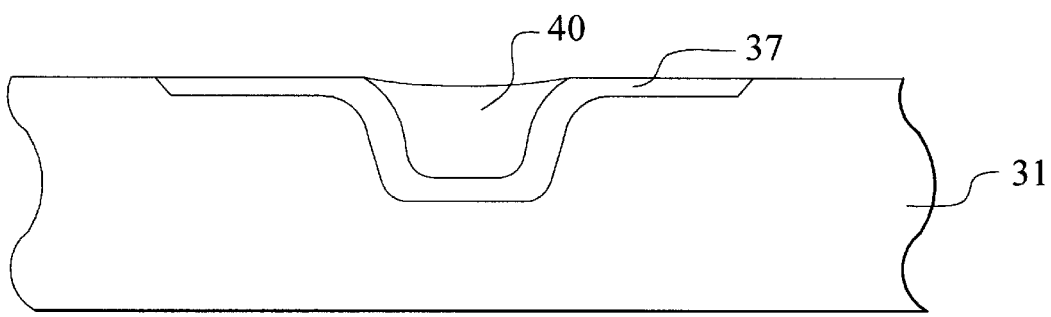

Finally, referring to FIG. 11, a chemical cleaning and an oxide strip are performed on the wafer using buffered HF. This etch step has to be timed to provide exact removal of the residual pad oxide left after the chemical cleaning. The time required for the etch depends on the particular buffered HF to be used. This time requires very careful tuning depending on silicon nitride removal, cleaning, and even the kind of chemical bath in use. In the preferred embodiment, an $HF:H_2O$ solution in a 1:100 ratio is used yielding an etch time of between about 650 and 750 seconds. After this process step, the STI structure is complete.

Figure 12:
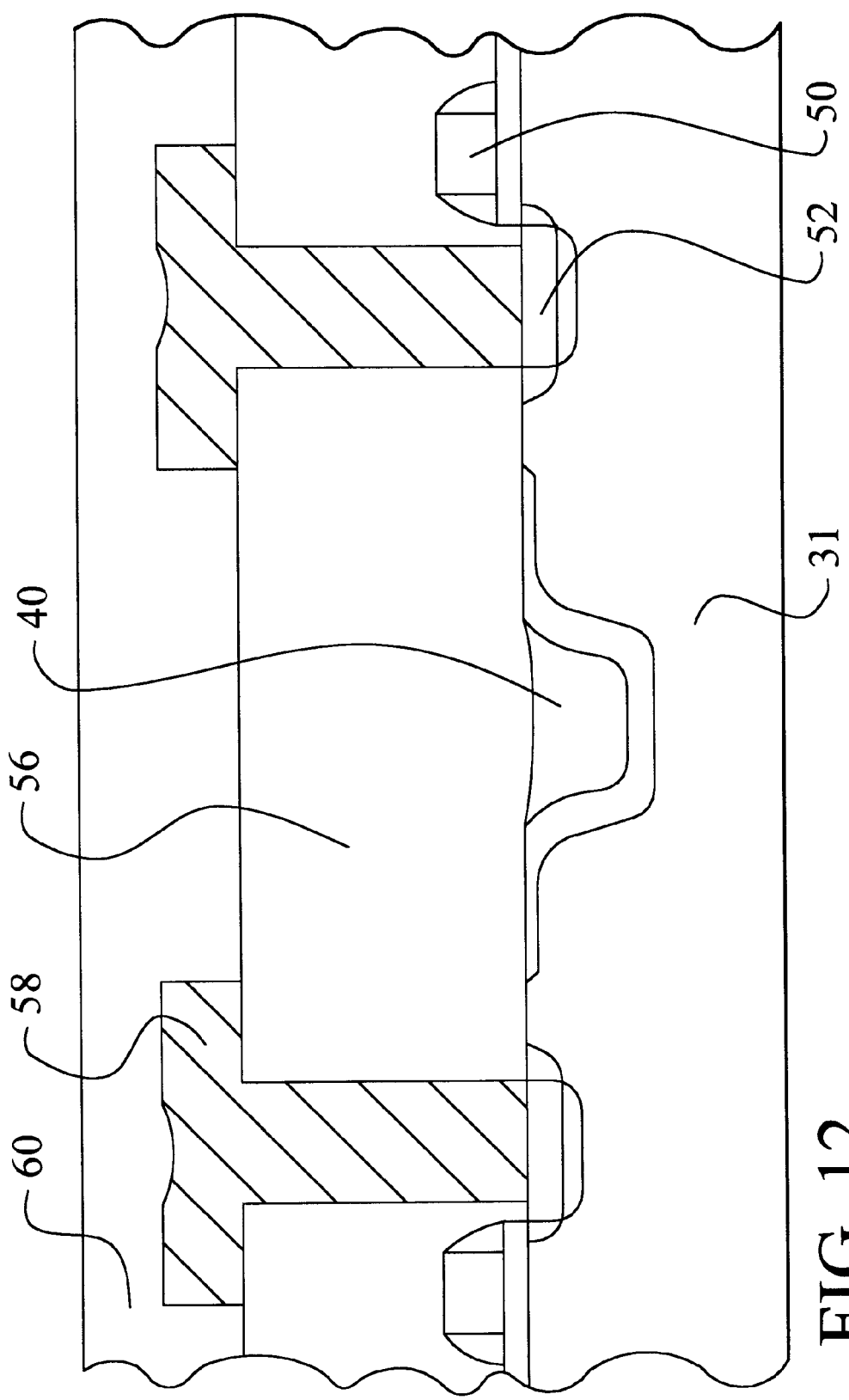

Processing continues as is conventional in the art to fabricate semiconductor devices in and on the substrate in the active regions separated by the STI regions of the present invention. For example, as illustrated in FIG. 12, gate electrodes 50 and source and drain regions 52 have been fabricated in and on the semiconductor substrate 31. Patterned conducting lines 58 have been formed in contact openings through insulating layer 56 to complete electrical connections. Passivation layer 60 completes the integrated circuit device.

Figure 1:
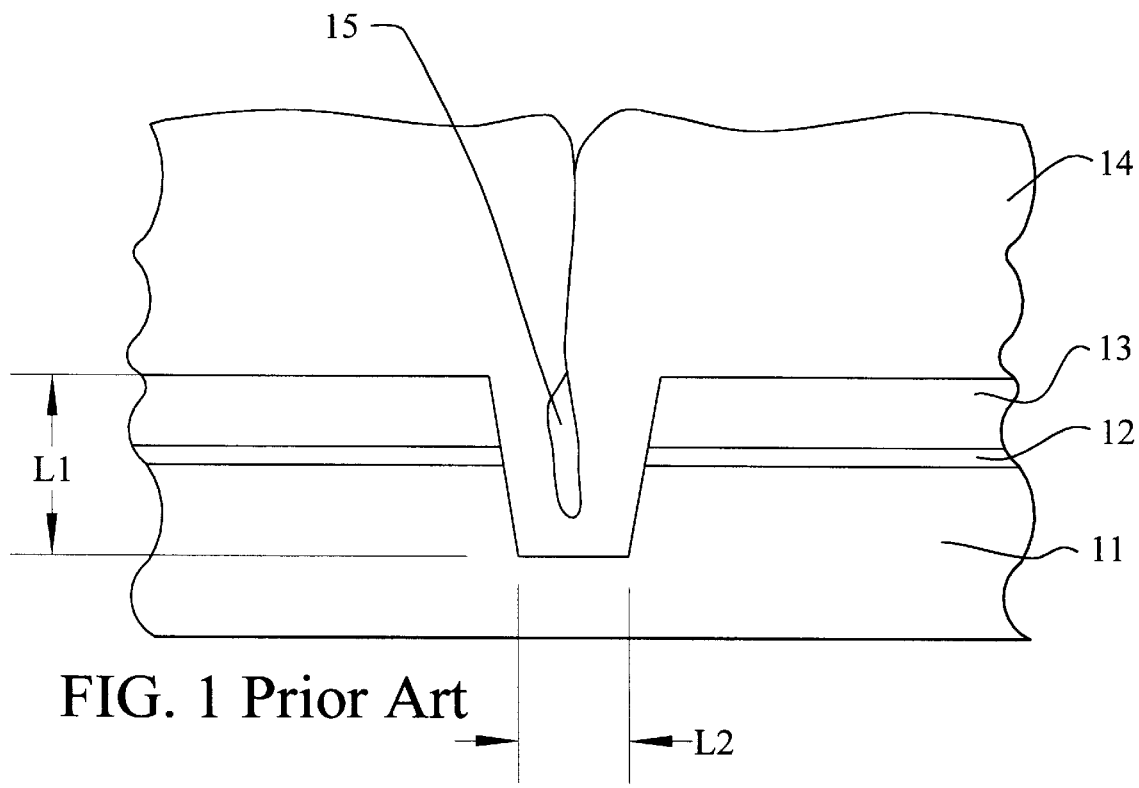
FIG. 1 schematically illustrates in cross-section a partially completed prior art STI structure showing a void formed in the isolation dielectric.

It can now be demonstrated how the process features positively impact the performance and manufacturability of the STI structure. First, compare the cross-section of the partially completed STI structure of the preferred embodiment depicted in FIG. 8 with that of the prior art topology shown in FIG. 1. Note how the key feature of undercutting the silicon nitride edges, that is depicted in FIG. 5 and FIG. 6, has given the remaining trench a stair step profile. Because of this topology, the trench of the preferred embodiment can exhibit an effective aspect ratio of 1:1 during isolation dielectric deposition even though the etched trench aspect ratio is actually 1.5:1. The lower effective aspect ratio means that the isolation dielectric material more easily and completely fills the trench during deposition. Thus, it is much less likely that voids will form in the isolation material.

Figure 2:
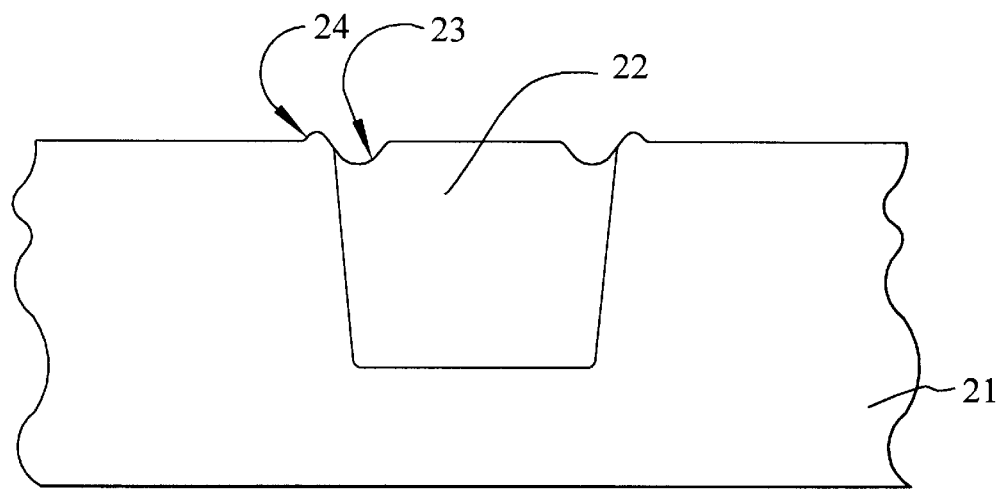
FIG. 2 schematically illustrates in cross-section a prior art STI structure showing recession of the isolation dielectric at the corners of the substrate active area.

Second, compare the cross-sectional view of the STI structure of the preferred embodiment illustrated in FIG. 11 with the prior art cross-section shown in FIG. 2. The edge recesses of the surface of the isolation dielectric have been eliminated. This is directly due to the key feature of the embodiment, illustrated in FIG. 10, where the isolation dielectric overlaps the active corners prior to the final oxide strip. This overlap eliminates the formation of the local recess during the oxide strip. Because of the elimination of the isolation dielectric recession at the active area corners, problems such as sub-threshold leakage currents and reduction in gate oxide dielectric breakdown are eliminated.

Third, the key silicon nitride undercut step that is depicted in FIG. 5 and FIG. 6 and the key liner oxide step depicted in FIG. 7 cause a rounding of the corners of the top edges of the trench. This rounding is accompanied by more intensive recession of the silicon substrate due to the thermal liner oxide growth. Because of this profile, the finished STI structure is less susceptible to parasitic corner transistor formation.

The process of the present invention provides a very manufacturable process for forming STI structures with improved isolation fill and surface planarity.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated circuit device comprising:

providing a pad oxide layer over the surface of a semiconductor substrate;

depositing a silicon nitride layer overlying said pad oxide layer;

depositing a thin oxide layer overlying said silicon nitride layer;

etching an isolation trench through said thin oxide layer, said nitride layer, and said pad oxide layer and into said semiconductor substrate;

etching said silicon nitride layer exposed within said trench to form a lateral undercut leaving a projection of said thin oxide layer and exposing a portion of underlying said pad oxide layer;

etching away said thin oxide layer and the exposed portion of said pad oxide layer and thereby exposing portions of said surface of said semiconductor substrate;

growing a liner oxide on said exposed portions of said semiconductor substrate within said isolation trench and on said surface of said semiconductor substrate;

depositing a layer of isolation dielectric overlying said liner oxide and said silicon nitride and filling said isolation trench;

polishing away said isolation dielectric stopping at said silicon nitride layer;

etching away remaining said silicon nitride;

etching away said isolation dielectric and said pad oxide from said surface of said semiconductor substrate leaving said isolation dielectric only within said isolation trench; and completing said fabrication of said integrated circuit device.

2. The method according to claim 1 wherein said pad oxide layer is formed to a thickness of between about 100 and 200 Angstroms.

3. The method according to claim 1 wherein said silicon nitride layer is deposited to a thickness of between about 1500 and 2500 Angstroms.

4. The method according to claim 1 wherein said silicon nitride layer is etched such that said lateral undercut depth is not less than the thickness of said silicon nitride layer.

5. The method according to claim 1 wherein said liner oxide layer is grown to a thickness of between about 200 and 300 Angstroms.

6. The method according to claim 1 wherein said silicon nitride is used as a polishing stop for said polishing away of said isolating dielectric.

7. The method according to claim 1 wherein said isolation dielectric overlaps the edges of the active area corners of said trench immediately prior to said etching away of said isolation dielectric and said pad oxide from said surface of said semiconductor substrate.

8. The method according to claim 1 wherein said polishing away of said isolation dielectric is done by chemical mechanical polishing.

9. The method according to claim 1 wherein said isolation dielectric is deposited to a thickness of between about 5000 and 8000 Angstroms.

10. A method of fabrication of shallow trench isolation in the manufacture of an integrated circuit device comprising:

providing a pad oxide layer over the surface of a semiconductor substrate;

depositing a silicon nitride layer overlying said pad oxide layer;

depositing a thin oxide layer overlying said silicon nitride layer;

etching an isolation trench through said thin oxide layer, said nitride layer, and said pad oxide layer and into said semiconductor substrate;

etching said silicon nitride layer exposed within said trench to form a lateral undercut leaving a projection of said thin oxide layer and exposing a portion of underlying said pad oxide layer;

etching away said thin oxide layer and said exposed portion of said pad oxide layer thereby exposing portions of said surface of said semiconductor substrate;

growing a liner oxide on said exposed portions of said semiconductor substrate within said isolation trenches and on said surface of said semiconductor substrate;

depositing a layer of isolation dielectric overlying said liner oxide and said silicon nitride and filling said isolation trench;

polishing away said isolation dielectric stopping at said silicon nitride layer;

etching away remaining said silicon nitride whereby said isolation dielectric overlaps the edges of the active area corners of said trench;

etching away said isolation dielectric and said pad oxide from said surface of said semiconductor substrate wherein said isolation dielectric overlapping said active area corners of said isolation trench prevents exposure of said active area corners during said etching away; and completing said fabrication of said shallow trench isolation in said manufacture of said integrated circuit device.

11. The method according to claim 10 wherein said pad oxide layer is formed to a thickness of between about 100 and 200 Angstroms.

12. The method according to claim 10 wherein said silicon nitride layer is deposited to a thickness of between about 1500 and 2500 Angstroms.

13. The method according to claim 10 wherein said silicon nitride layer is etched such that said lateral undercut depth is not less than the thickness of said silicon nitride layer.

14. The method according to claim 10 wherein said liner oxide layer is grown to a thickness of between about 200 and 300 Angstroms.

15. The method according to claim 10 wherein said silicon nitride is used as a polishing stop for said polishing away of said isolating dielectric.

16. The method according to claim 10 wherein said polishing away of said isolation dielectric is done by chemical mechanical polishing.

17. The method according to claim 10 wherein said isolation dielectric is deposited to a thickness of between about 5000 and 8000 Angstroms.

18. A method of fabrication of an integrated circuit device comprising:

providing a pad oxide layer over the surface of a semiconductor substrate;

depositing a silicon nitride layer overlying said pad oxide layer;

depositing a thin oxide layer overlying said silicon nitride layer;

etching an isolation trench through said thin oxide layer, said nitride layer, and said pad oxide layer and into said semiconductor substrate;

etching said silicon nitride layer exposed within said trench to form a lateral undercut such that said lateral undercut depth is not less than the thickness of said silicon nitride layer and leaving a projection of said thin oxide layer and exposing a portion of underlying said pad oxide layer;

etching away said thin oxide layer and the exposed portion of said pad oxide layer;

depositing a layer of isolation dielectric overlying said silicon nitride and filling said isolation trench;

polishing away said isolation dielectric stopping at said silicon nitride layer;

etching away remaining said silicon nitride whereby said isolation dielectric overlaps the edges of the active area corners of said trenches;

etching away said isolation dielectric and said pad oxide from said surface of said semiconductor substrate wherein said isolation dielectric overlapping said active area corners of said isolation trenches prevents exposure of said active area corners during said etching away; and completing said fabrication of said integrated circuit device.

19. The method according to claim 18 further comprising growing a liner oxide on said exposed portion of said semiconductor substrate within said isolation trench before said step of depositing said layer of isolation dielectric.

20. The method according to claim 18 wherein said polishing away of said isolation dielectric is done by chemical mechanical polishing.

* * * * *